United States Patent [19]
Rada et al.

[11] Patent Number: 5,475,566
[45] Date of Patent: Dec. 12, 1995

[54] INTERLOCKING HOUSING AND CASE ASSEMBLY HAVING A CIRCUIT BOARD DISPOSED PARALLEL TO A FRONT PANEL

[75] Inventors: Mark Z. Rada, Kokomo; Colin G. J. Lock, Noblesville; Glenn E. Ferris, Fishers; Mark A. Jackson, Kokomo, all of Ind.

[73] Assignee: Delco Electronics Corporation, Kokomo, Ind.

[21] Appl. No.: 262,182

[22] Filed: Jun. 20, 1994

[51] Int. Cl.⁶ .............................. H05K 1/14; H05K 5/00; H05K 7/14
[52] U.S. Cl. ........................ 361/736; 361/756; 361/796
[58] Field of Search ........................... 174/52.1, 50, 52.4; 206/261, 262, 263, 268, 328, 332, 334; 220/4.21, 4.22, 4.23, 4.24, 241, 242, 337, 339; 361/728, 736, 752, 757, 759, 796

[56] References Cited

U.S. PATENT DOCUMENTS 4,585,122  4/1986  Stegenga ........................ 206/334
4,652,969  3/1987  Stegenga ........................ 206/328

FOREIGN PATENT DOCUMENTS 63-292694  11/1988  Japan .......................... 361/796
4-56195    2/1992   Japan .......................... 361/752

Primary Examiner—Donald A. Sparks
Attorney, Agent, or Firm—Jimmy L. Funke

[57] ABSTRACT

An enclosure for electronic instrument panel circuitry including a circuit board, a front housing with rear lower and upper locking flanges, and a two part case, preferably articulated at the rear for clamshell operation. The case has flanges on each part for interlocking with the housing, without separate fasteners. The circuit board is located in the case and connected to the housing before the case is closed. Support members molded in the case hold the circuit board in place and a single screw further secures the circuit board. A second circuit board on the rear of the housing is trapped by its margin between the housing and case, and held without screws.

2 Claims, 3 Drawing Sheets

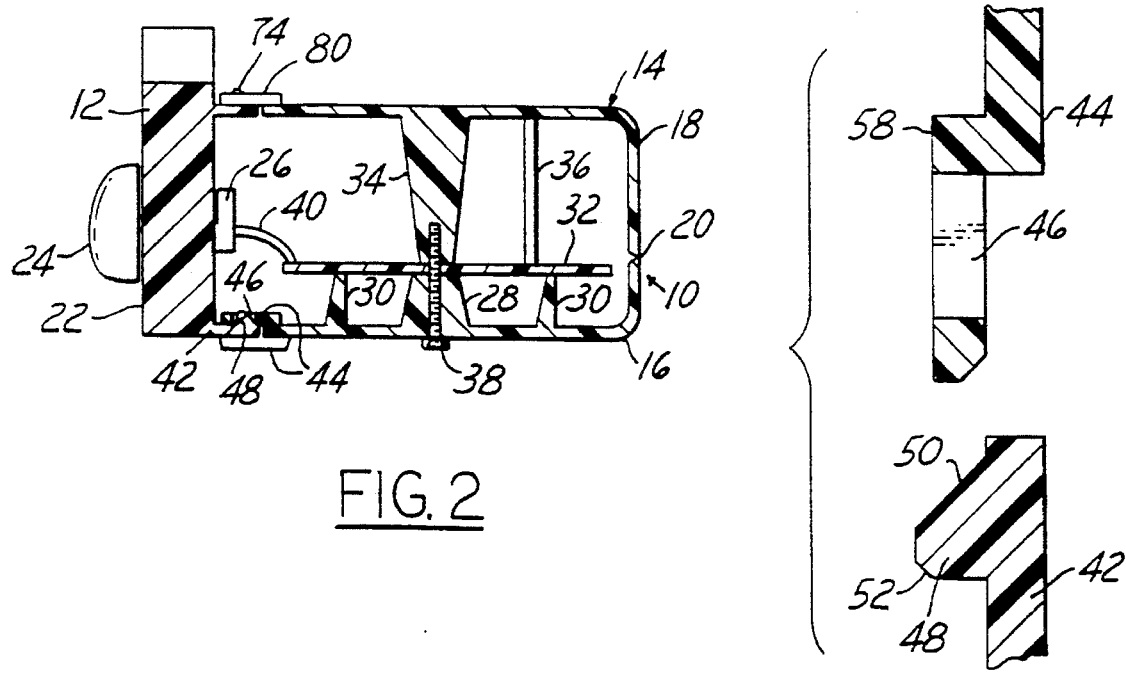
FIG. 2
FIG. 4
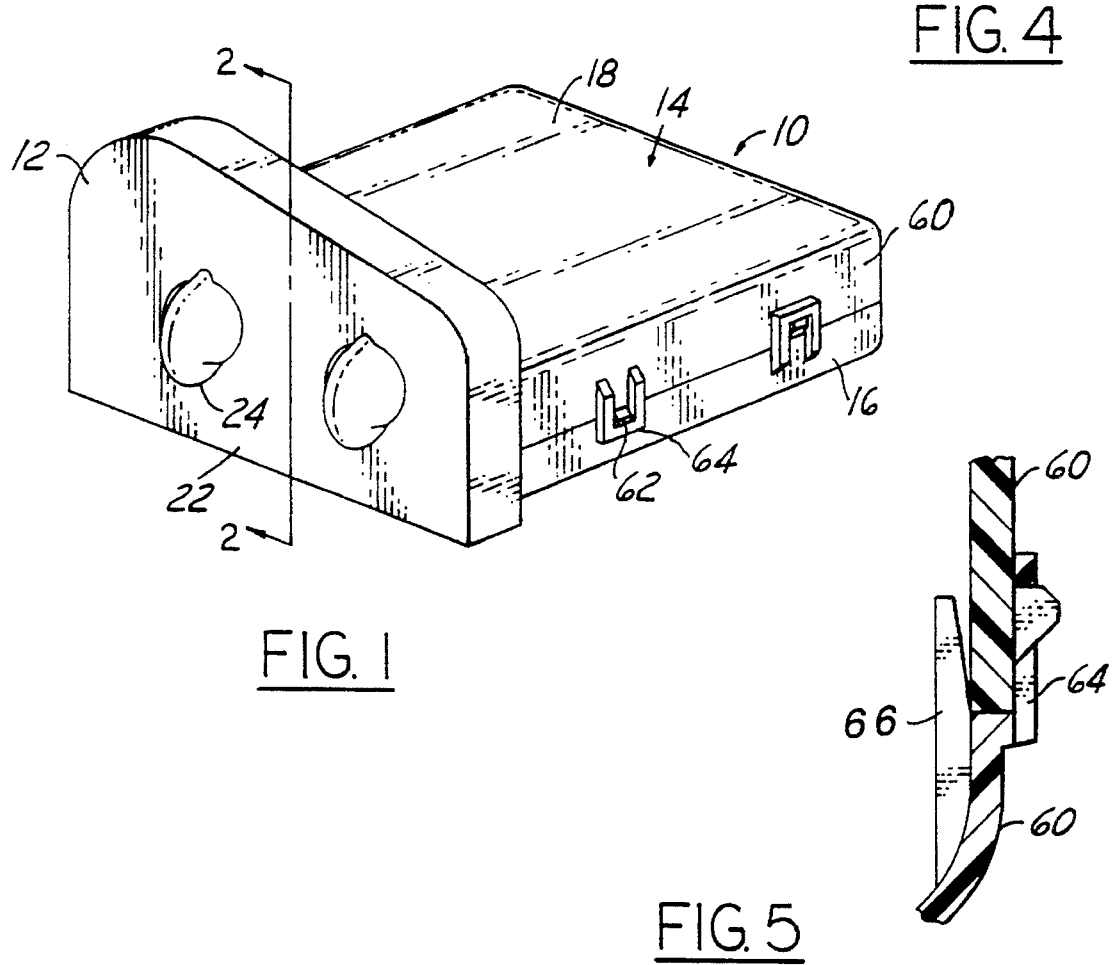
FIG. 1
FIG. 5

5,475,566

INTERLOCKING HOUSING AND CASE ASSEMBLY HAVING A CIRCUIT BOARD DISPOSED PARALLEL TO A FRONT PANEL

FIELD OF THE INVENTION

This invention relates to an electrical equipment enclosure and particularly to such an enclosure comprising an assembly of a housing and a case.

BACKGROUND OF THE INVENTION

In automotive instrument panels individual display or controller components, for example for heater and air conditioner control, are packaged separately from other such components. This allows circuits board dedicated to the function of that component and other circuit elements and their interconnections to be assembled into a protective environment and tested before installation into the instrument panel. Each such component may have manually controlled input knobs or push buttons mounted on a housing having a front panel for use by the vehicle operator, so that wiring or cables are necessary for coupling such front panel devices to the circuit board or other control circuitry within the enclosure. The housing in some cases includes an additional printed circuit board or keyboard mounted on the rear face of the housing parallel to the front panel.

Heretofore it has been known to use a one-piece rigid case having an open end which is married to the housing and secured by a number of screws. A track within the case is provided to slidably accept a circuit board, and a long interconnect cable coupling the housing to the circuit board is stuffed into the case during assembly to the housing. Such an assembly results in loose circuit boards which do not fit securely in the case and additional screws are needed to secure the circuit board. Assembly problems due to so many screws and the long cable are evident, and the cable routing cannot be controlled.

Additional prior structures include a two-piece sheet metal or molded plastic case which allows closure of a cover after the circuit board is installed and the cable is arranged. Such a molded case may have the two case pieces joined at a living hinge to operate in a clamshell fashion. In any event, these enclosure schemes still require a number of screws to hold the circuit board in position and to assemble the case to the housing. In addition, where a key board is used, additional fasteners are used to secure it to the housing. Forming the necessary screw holes in the mounting flanges of a molded case requires expensive molding equipment.

SUMMARY OF THE INVENTION

It is therefore an object of the invention to eliminate substantially all the screws in a housing and case enclosure for electrical components. Another object is to improve the ease of assembly of the enclosure. Still another object is to use a casing configuration which can be accomplished with conventional tooling.

An electronic enclosure suitable, for example for motor vehicle instrumentation, contains one or more printed circuit boards with electronic components and has housing including a face panel supporting display devices and/or control knobs and the like. The devices on the face panel are connected by a flexible cable to the enclosed printed circuit boards. A case is attached to the face panel and comprises two molded parts which are separate, joined by integral snap fasteners or by a living hinge so that they may be separate or open for assembly of the printed circuit boards and the flexible cable, and subsequently closed to form a case enclosure. Interlocking snap fasteners secure at least one of the case parts to the housing and the case parts to one another. For simplicity of assembly only one screw is required to secure the case parts and circuit board together.

In a first embodiment, a printed circuit board is clamped within the enclosure between supports projecting from each case part by a screw passing through one support, through an aperture in the printed circuit board, and into the other support.

A printed circuit board is positioned behind and parallel to the face panel and its margins are trapped and securely held in a small space between the housing and the case parts.

BRIEF DESCRIPTION OF THE DRAWINGS

The above and other advantages of the invention will become more apparent from the following description taken in conjunction with the accompanying drawings wherein like references refer to like parts and wherein:

FIG. 1 is an isometric view of an electronic enclosure comprising a housing and case assembly according to the invention;

FIG. 2 is a cross-sectional view of the enclosure taken along line 2—2 of FIG. 1;

FIG. 4 is an enlarged sectional view of a fastener detail of the FIG. 1 assembly;

FIG. 5 is an enlarged sectional view of a fastener detail taken along line 5—5 of FIG. 3;

DESCRIPTION OF THE INVENTION

Figure 3:
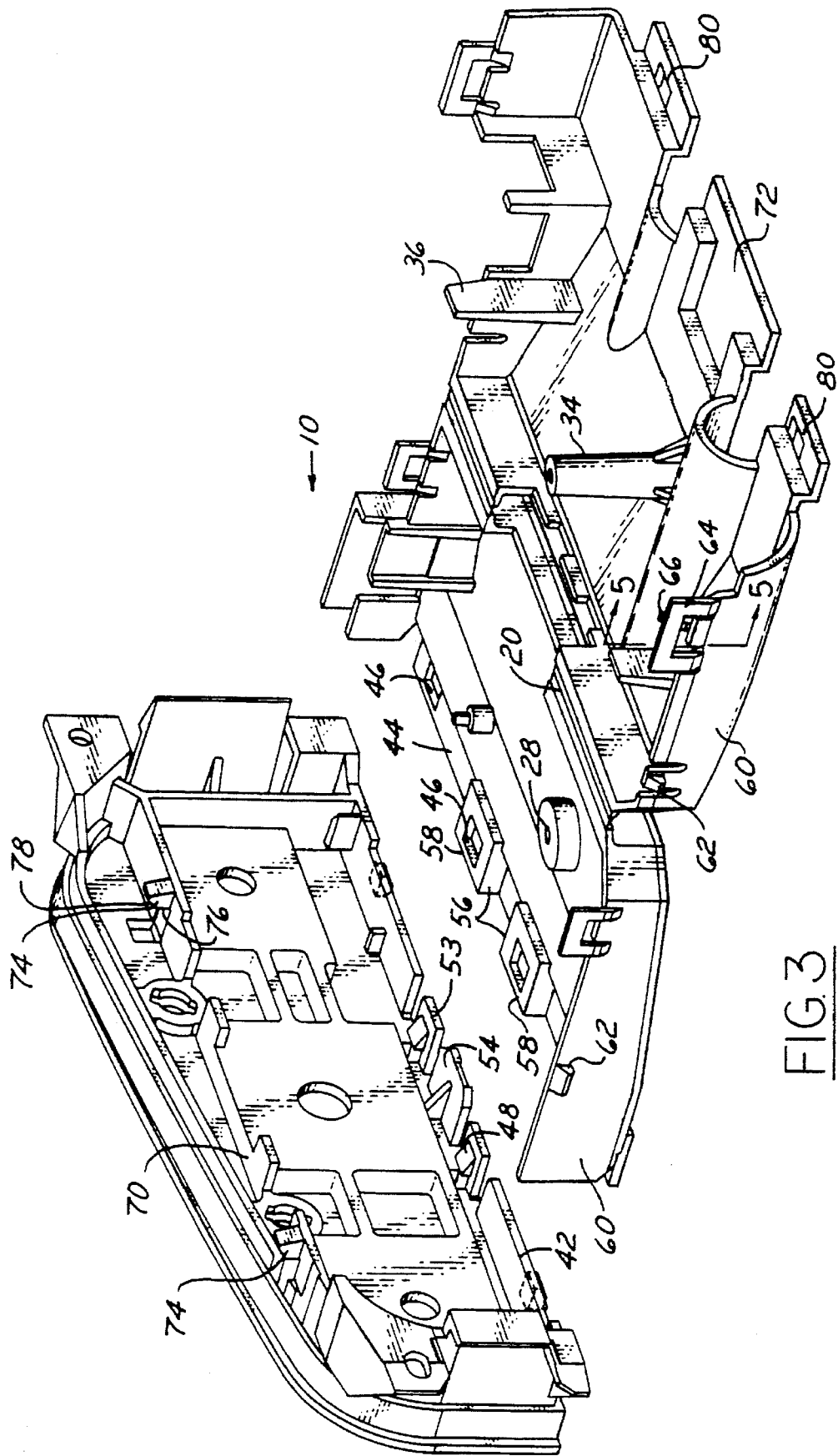
FIG. 3 is an exploded view of the assembly of FIG. 1 with the case opened.

The ensuing description and claims use positional referenced such as upper, lower, downward, vertical, etc. which are intended to describe relative positions of parts, not absolute orientation. That is, the electronic enclosure, however assembled, may be used in any desired orientation.

Referring to FIGS. 1 and 2, an electronic enclosure 10 for vehicle instrumentation comprises a molded plastic housing 12 and a molded plastic two-part case 14 having a base 16 and a cover 18 joined by a flexible web 20 at the rear, that is, at the edge remote from the housing 12. The housing 12 includes a front panel 22 which is generally in a vertical plane when in use, and knobs 24 or other input devices disposed on the panel and extending through to a control device 26 on the rear of the housing 12. The base and cover extend generally horizontally from the housing, or transverse to the front panel. If the enclosure were to employ a keyboard it would typically be attached to the rear face of the housing 12 parallel to the front panel and would then be able to support the control device 26 and to make electrical connections to it.

The base 16 of the case 14 has a main support 28 and auxiliary supports 30 extending up from the bottom to mount the main circuit board 32. A post 34 depending from the top of the cover 18 and aligned with the support 28 bears on the circuit board 32 to hold it in place against the support, and additional small posts or blades 36 on the cover 18 also engage the top of the circuit board to hold it. A bore formed in the post 34, and aligned apertures in the circuit board 32 and the support 28 receive a screw 38 inserted from the bottom which threads into the post and pulls down the post toward the support. This is the only screw used in the housing and case assembly. A cable 40 couples the circuit board 32 to the housing 12, particularly to the control device 26 or to a keyboard, if present.

The housing 12 has a lower rear flange 42 engaging a mating bi-level flange 44 on the bottom edge of the base 16, the two flanges having integrally molded interlocking fastener details comprising tabs 48 on the lower flange 42 fitting into windows 46 on the base flange 44, as best shown in FIGS. 3 and 4. A ramp 50 on the forward edge of the tab assists in snapping the window portion over the tab, and a back ramp 52 beyond the crest of the tab assists the window in slipping over the rear surface of the tab. This back ramp reduces the dimensional tolerance required for easy assembly and thus provides a tight fit. The snap fasteners prevent movement of the base 16 in a direction normal to the front panel. Some of the tabs 48 are on the upper surface of the flange 42 and some are on the under surface, so that the windowed portions of the bi-level case flange 44 engage both upper and lower surfaces of the flange 42 to confine the flange 42 and prevent vertical movement of the base relative to the housing. The upward facing tabs 48 are mounted on resilient pieces 53 to facilitate snap assembly to the windows 46. Retention in the lateral direction is assured by a rigid center piece 54 with chamfered corners which fits between vertical walls 56 of raised window features 58 on the base flange 44. Thus the combination of snap fasteners and other provisions to prevent removal of the base 16 from the housing 12 results in interlocking flanges 42, 44 which provide the structural backbone of the assembly. The assembly procedure is simple and requires no screw fasteners.

The base and cover parts of the case 14 each have vertical side walls 60 which meet at a common interface and which carry additional snap fastener features for locking when the case is closed. Some of the fasteners have the tab 62 on the base part and others are on the cover part, with the cooperating windowed snap 64 on the opposite part. The tabs 62 are substantially the same as tabs 48, already described, and in particular have the back ramp which assures a tight fit and easy locking of the fastener parts. In addition, as shown in FIG. 5, a blade or finger 66 supported on the inside of the case 14 opposite the windowed snap 64 which is supported on the outside of the case 14, retains the vertical wall 60 of the base at its proper position when the flexible snap 64 is bearing against the rigid tab 62. The finger tapers away from the wall 60 to allow some freedom of movement when the snap 64 first engages the tab, but closely confines the wall when the fastener nears full engagement.

The housing 12 has a rear upper flange 70 which mates in overlapping relationship with the front flange 72 of the cover 18. The upper flange 70 carries a pair of upstanding lugs 74 which have a vertical forward wall 76 and a back ramp 78. The flange 72 on the cover 18 include window portions 80 which fit over the lugs 74 when the case is closed. During closure, since the case is hinged at the web 20 in the rear, the flange 72 moves in an arc which is nearly vertical at the point of engagement of the lugs 74, so that the window portions 80 engage the back ramp 78 and slide onto the front vertical wall 76. During this movement the snap fasteners 62, 64 on the side walls 60 lock together, thereby holding the flange 72 down against the upper flange 70. In this condition the window portions 80 cannot separate from the lugs 74 and the cover 18 is thus locked to the housing 12. After the case is closed the single screw 38 is installed to tighten the internal parts against the circuit board 32 and to provide additional locking force.

Figure 6:
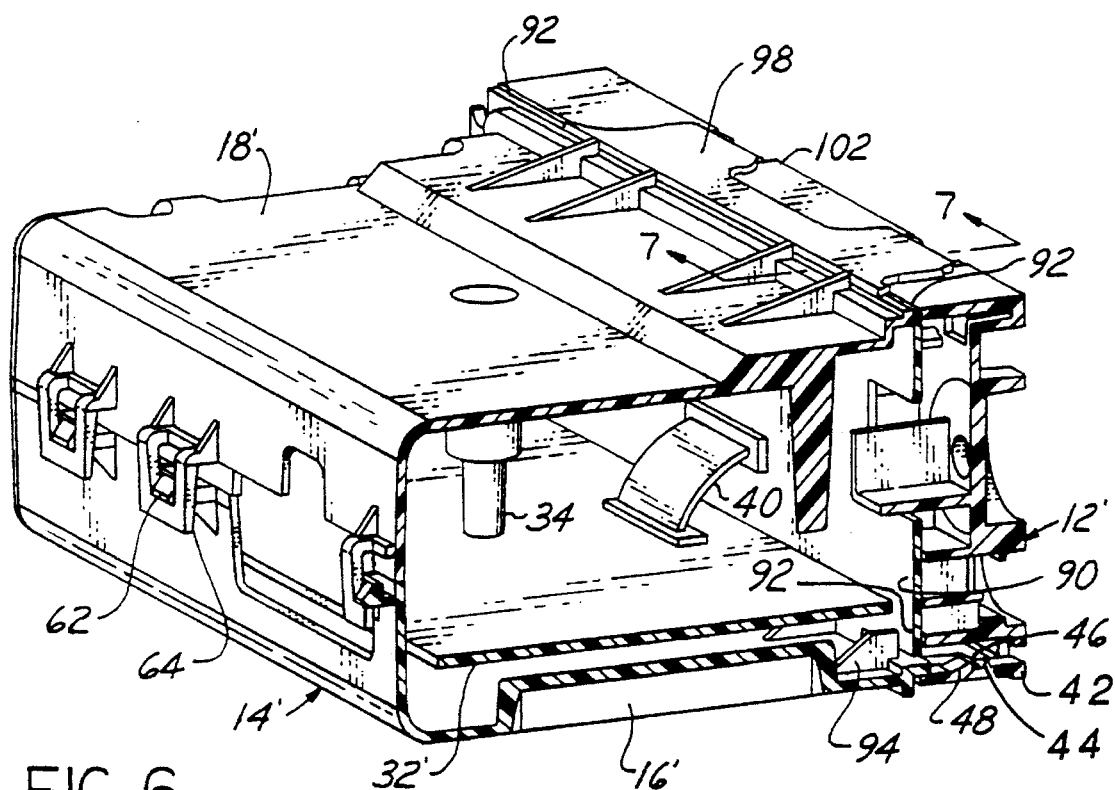
FIG. 6 is a sectional isometric view of a housing and case assembly according to another embodiment of the invention.
Figure 7:
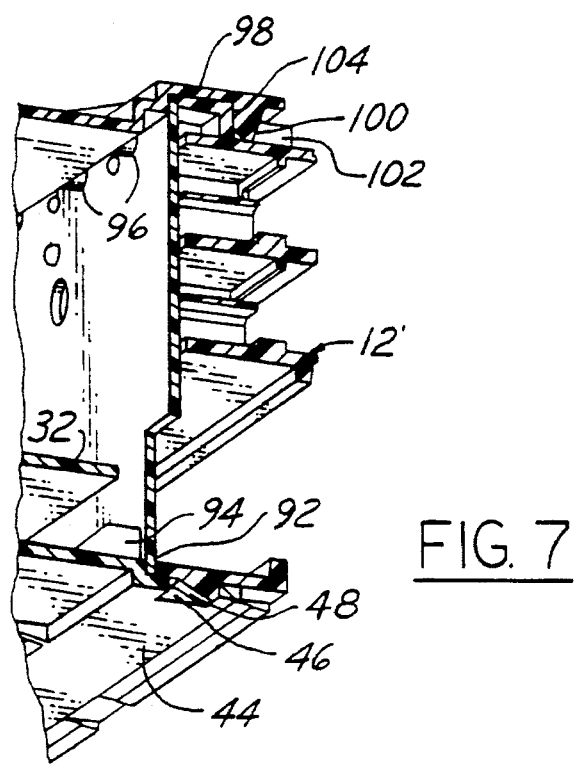
FIG. 7 is a sectional isometric view of the housing and case assembly of FIG. 6 taken along line 7—7.

FIGS. 6 and 7 show another version of the electronic enclosure which is the same as that described above as regards the housing and case interlocking features and the retention of the circuit board 32. In particular, the interlocking lower rear flange 42 on the housing has tabs 48 engaging windows 46 in the mating case flange 44 to securely hold the base to the housing, as in the FIG. 1 embodiment. However this version includes another circuit board or keyboard 90 mounted parallel to the front panel at the interface of the housing 12' and the case 14'. Margins 92 of the keyboard extend into a space between the housing and the case and are trapped there when the base 16' is locked to the housing and the cover 18' is closed against the housing. To firmly secure the keyboard 90, the base 16' has a plurality of retainer tabs 94 adjacent the keyboard for pushing the lower margin of the keyboard against the lower part of the housing 12'. Similarly, a row of abutments 96 along the front edge of the cover 18' engage the upper margin of the keyboard 90 to urge it against the upper part of the housing. In each case, the retainer tabs or abutment elements are closely spaced from the housing by the amount of the keyboard thickness to hold the keyboard tightly when assembled.

Before the cover is closed the interconnect cable 40 is attached between the main circuit board 32 and the keyboard 90, and the cable routing is properly located. In this example, the base and cover are separate parts and upon assembly they are attached at the rear by snap fasteners 62 and 64 instead of a hinge. The front edge of the cover comprises a panel 98 which overlies part of the upper surface of the housing 12' and, as best shown in FIG. 7, terminates am two fingers 100 which extend down into recesses 102 in the top front of the housing to securely engage respective front walls 104 of the housing, thereby preventing the cover from pulling back from the housing. The side walls of the base 16' and cover 18' have snap fasteners, not shown, like those in FIG. 1 to hold the base and cover together.

The embodiments of the invention in which an exclusive property or privilege is claimed are defined as follows:

1. An enclosure for electronic circuitry, comprising:

a housing including a front panel, a rear lower flange, and an upper flange;

first fastener means integral with the lower flange;

second fastener means integral with the upper flange;

a first case part transverse to the front panel and having integral third fastener means on one edge thereof for coupling to the first fastener means on the rear lower flange, to thereby attach the first case part to the housing;

a second case part transverse to the front panel and having integral fourth fastener means on one edge thereof for coupling to the second fastener means on the upper flange, to thereby attach the second case part to the housing;

integral case part means for securing the case parts at other edges thereof;

wherein each of the case parts have interface edges opposing and spaced from interface edges of the housing; and a printed circuit board disposed generally parallel to the front panel and having a margin trapped between the opposed interface edges, whereby the circuit board is secured within the enclosure.

2. The invention as defined in claim 1 including means for pressing the circuit board margin against the housing comprising a plurality of retainer elements on the case adjacent the circuit board and closely spaced from the interface edges of the housing.

\* \* \* \* \*